United States Patent [19]

Legendre et al.

[11] 4,262,250

[45] Apr. 14, 1981

[54] MICROWAVE MEASURING DEVICE

[75] Inventors: Philippe Legendre; Claude Van Kerrebroeck, both of Paris, France

[73] Assignee: Thomson-CSF, Paris, France

[21] Appl. No.: 2,306

[22] Filed: Jan. 10, 1979

[30] Foreign Application Priority Data

Jan. 20, 1978 [FR] France ............................ 78 01635

[51] Int. Cl.³ .................. G01R 21/00; H01Q 1/50
[52] U.S. Cl. .............................. 324/95; 333/127; 343/864
[58] Field of Search ................... 324/95; 333/127; 343/864

[56] References Cited

U.S. PATENT DOCUMENTS

| | | | |
|---|---|---|---|
| 2,150,246 | 3/1939 | Roberts | 343/864 |
| 2,205,874 | 6/1940 | Buschbeck | 343/864 |
| 2,273,465 | 2/1942 | Carter | 343/864 |
| 2,643,296 | 6/1953 | Hansen | 333/127 |

*Primary Examiner*—Ernest F. Karlsen
*Attorney, Agent, or Firm*—Cushman, Darby & Cushman

[57] ABSTRACT

A device for measuring the power in a microwave transmission and for providing a measuring port at the output of a microwave signal generator or transmitter. First and second quarter wavelength transmission line sections, coupled in series with one another and having characteristic impedances $Z_2$ and $Z_1$ respectively, where $Z_2 >> Z_1$, are coupled at the first section to a predetermined point on a transmission line to be monitored. A port at the free end of the second section allows for the connection of two independent measuring circuits to the transmission line.

3 Claims, 1 Drawing Figure

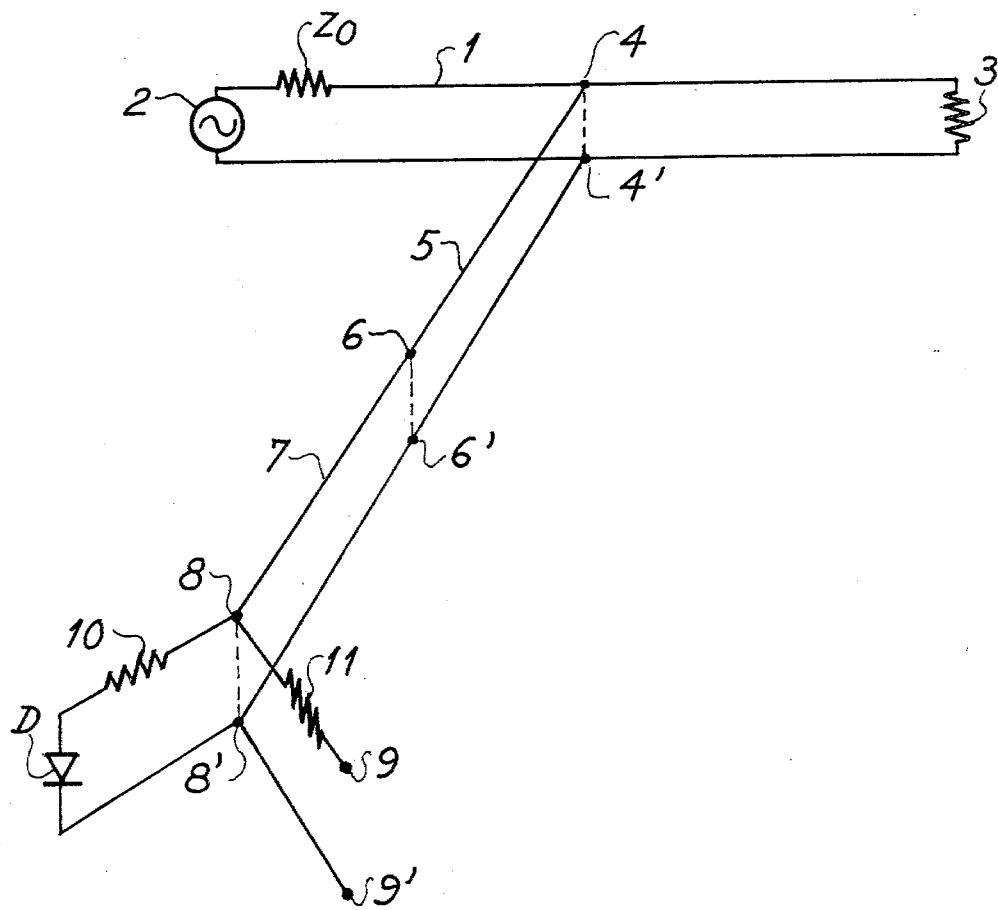

MICROWAVE MEASURING DEVICE

This invention relates to microwave devices, and more particularly to such devices which derive power through a shunt at a predetermined point along a matched transmission line in order to determine the level of power being transmitted over the line and to measure the characteristic of the corresponding signal through the use of a standard impedance measurement port.

It is known that both of such functions can be performed independently by the use of two cascaded directional couplers, but this is a costly and delicate approach, particularly at frequencies above 4 GHz.

The purpose of this invention is to remedy this deficiency while maintaining the independence of both necessary functions through the use of a single non-directional circuit.

Accordingly, the present invention provides a measuring instrument capable of deriving power at a given point along a matched microwave transmission line, having a characteristic impedance $Z_o$. The measuring instrument includes a first section of line having a characteristic impedance $Z_2$, one end of which is coupled to a predetermined point along the transmission line and a second section of line having a characteristic impedance $Z_1$, where $Z_1 < Z_2$, coupled in series to the first section of line, the other end thereof being coupled to an application utilization circuit, the first and second sections being of equal electrical lengths, that is, one quarter of the wavelength of the middle signal of the signals being fed through the transmission line being monitored.

The invention will be more fully understood and other features will be made apparent by reference to the following detailed description with the appended claims, when considered in conjunction with the accompanying drawing, wherein:

The FIGURE is a schematic representation of the measuring device according to the present invention.

Referring now the FIGURE, one end of a twin line 1 having a characteristic impedance $Z_o$ is fed by a signal generator 2 having an internal impedance $Z_o$ and closed at the other end by a resistor 3 having an impedance equal to $Z_o$.

At a point 4-4' on this line there is coupled, by the use of a shunt, a section of line 5 having a characteristic impedance $Z_2$ connected at its end 6-6' to a second section of line 7 having a characteristic impedance $Z_1$, whose ends 8-8' are coupled on the one hand to a diode D having an impedance $Z_D$ in series with a resistor 10 having an impedance $Z_R$ and, on the other hand, to terminals 9-9' through a resistor 11.

Diode D and resistor 10 represent a detector system which, in particular, is capable of yielding a typical voltage for the power transmitted over line 1. Terminals 9-9' are a port through which conventional measuring instruments may be coupled.

It is assumed that $\lambda$ is the wavelength of the signal corresponding to the center frequency of the frequency spectrum transmitted by line 1.

Line sections 5 and 7 are of identical electrical lengths and equal to $\lambda/4$.

Impedance $Z_{4-4'}$ between points 4-4' is equal to $Z_o/2$ since the line feed and load impedance are in parallel, identical, and equal to the characteristic impedance $Z_o$.

It is transformed by line section 5 and seen at point 6-6' as an impedance $Z_{6-6'}$, such that $Z_{6-6'} = Z_2^2/Z_{4-4'}$, that is, $Z_{6-6'} = 2Z_2^2/Z_o$.

Similarly, at the end of the shunted stub 8-8', the impedance seen is $Z_{8-8'} = Z_1^2/Z_{6-6'}$, that is $Z_{8-8'} = Z_o Z_1^2/2Z_2^2$.

On condition that the values of $Z_1$ and $Z_2$ are subjected to the inequality $Z_1^2 >> Z_2^2$, $Z_{8-8'}$ will be much less than $Z_o$.

To the extent that the load impedance $Z_C$ of the entire utilization circuit coupled to terminals 8-8' is of the same order as $Z_o$, $Z_C$ will present negligible load for $Z_{8-8'}$, and the two branches of the utilization circuit will be independent. $Z_C$ presents a negligible load to $Z_{8-8'}$, if $Z_C >> Z_{8-8'}$ i.e., $Z_C >> Z_o Z_1^2/2Z_2^2$.

A calculation similar to that performed for $Z_{8-8'}$ gives the following value for impedance $Z'_{4-4'}$ because of the effect on $Z_C$ of line section 7 followed by line section 5:

$$Z'_{4-4'} = Z_C Z_2^2/Z_1^2$$

As an example, let us assume that power $P_M$ at terminals 9-9' is desired to be 20 dB lower than power $P_E$ transmitted over line 1 at point 4-4', and that the measuring instruments which are planned to be connected at terminals 9-9' have standard point impedance equal to the characteristic impedance of line $Z_o$.

This assumption implies that the instruments should then be matched to the feed by giving a $Z_o$ impedance to resistor 11 (because of the negligible value of $Z_{8-8'}$) and by selecting a $Z_R$ impedance value such that $Z_R + Z_D = 2Z_o$, which will produce $Z_C = Z_o$. In the extreme case where terminals 9-9' would not be connected (open circuit) or would be short-circuited, the value of $Z_C$ would then change to $2Z_o$ or $2Z_o/3$, respectively.

Under these conditions, a simple calculation shows that when $Z_C = Z_o$, the following equation may be written:

$$P_M/P_E = \tfrac{1}{4}((Z_2^2/Z_1^2) + 1)$$

Assuming 10 log $P_M/P_E = 20$ dB, the following is obtained:

$$Z_2/Z_1 = 4.9 \qquad (1)$$

which meets the conditions $Z_2^2 >> Z_1^2$. The lower the $P_M/P_E$ ratio selected, the better that condition is fulfilled.

From the infinite number of possible pairs of $Z_1$ and $Z_2$ values which can meet the condition set forth in equation (1) above, a value of 78 ohms was selected for $Z_2$, as an example, giving a value of 16 ohms for $Z_1$, said values being independent of the value of $Z_o$, which was selected to be 50 ohms.

A simple calculation shows that at the center frequency, the power applied to diode $P_D$ in relation to power $P_E$ transmitted over line 1 may be expressed as follows:

$$P_D/P_E = Z_D Z_C/4Z_o((Z_C Z_2^2/Z_1^2) + Z_o)$$

$P_D$ is obviously equal to $P_M$ if $Z_D = Z_o$ and $Z_C = Z_o$.

The calculation also shows that the maximum mismatch at port 9-9' (either open or short-circuited) result in a maximum transmission loss of 0.3 dB in line 1, as well as in a minimum return loss of $-30$ dB (if the port is short-circuited).

Finally, frequency shifts of plus or minus 30% in relation to the center frequency produce a maximum transmission power increase of 2 dB at the measurement port 9–9' where the return loss is at least equal to $-20$ dB.

As for the change in the level of power applied to the detector, it will remain at less than 0.15 dB, under all conditions of frequency shifts ($\pm 30\%$) or of measurement port matching.

It should be noted that the attractive performance obtained with this device may be obtained for any mode of propagation and for any characteristic impedance.

The mode of implementation, which is illustrated in the FIGURE by twin lines for simplicity, may be achieved in practice by using one of the many configurations which are more appropriate for microwaves, particularly coaxial lines.

Such devices are intended for radio frequency signal generators, particularly local oscillation generators or for connection at the output of transmitters followed by an insulator and/or a matched load.

Obviously, other embodiments and modifications of the present invention will readily come to those of ordinary skill in the art having the benefit of the teachings presented in the foregoing description and the drawings. It is, therefore, to be understood that this invention is not to be limited thereto and that said modifications and embodiments are intended to be included within the scope of the appended claims.

What is claimed, is:

1. A measuring device capable of deriving power from a selected point of a matched microwave transmission line having a characteristic impedance $Z_o$, comprising:
    a first section of line having first and second ends and having a characteristic impedance $Z_2$, said first end of said first section of line being coupled to said selected point of said matched microwave transmission line;
    a second section of line having first and second ends and having a characteristic impedance $Z_1$, where $Z_1 < Z_2$, said first end of said second section being coupled to said second end of said first section so that said first and second sections are in series, said first and second line sections being of equal electrical lengths and equal to one quarter of the wavelength of the middle signal of the signals being fed to said matched microwave transmission line; and
    an utilization circuit having an impedance $Z_C >> Z_o Z_1^2 / 2 Z_2^2$ coupled to said second end of said second section of line, said utilization circuit including detection facilities comprising an impedance $Z_R$ in series with an impedance $Z_D$ such that $Z_R + Z_D >> Z_C$.

2. A measuring device according to claim 1 wherein said utilization circuit further includes a measurement port in series with an impedance $Z_{R'}$, forming a circuit coupled in parallel with said detection facilities.

3. A measuring device according to claim 2, wherein $Z_{R'} = Z_o$ and $Z_R + Z_D = 2Z_o$, $Z_C$ being equal to $Z_o$ if a measuring instrument, having an input impedance equal to $Z_o$ is coupled to said measurement port.

* * * * *